(12) United States Patent
Brunschwiler et al.

(10) Patent No.: US 7,547,582 B2
(45) Date of Patent: Jun. 16, 2009

(54) METHOD OF FABRICATING A SURFACE ADAPTING CAP WITH INTEGRAL ADAPTING MATERIAL FOR SINGLE AND MULTI CHIP ASSEMBLIES

(75) Inventors: Thomas J Brunschwiler, Thalwil (CH); Bruno Michel, Adliswil (CH); Ryan Joseph Linderman, Zurich (CH); Urs Kloter, Dietikon (CH); Hugo E Rothuizen, Adliswil (CH)

(73) Assignee: International Business Machines Corporation, Armonk, NY (US)

( * ) Notice: Subject to any disclaimer, the term of this patent is extended or adjusted under 35 U.S.C. 154(b) by 173 days.

(21) Appl. No.: 11/535,091

(22) Filed: Sep. 26, 2006

(65) Prior Publication Data

US 2008/0073775 A1 Mar. 27, 2008

(51) Int. Cl.
*H01L 21/00* (2006.01)
*H01L 23/12* (2006.01)
*H05K 7/20* (2006.01)

(52) U.S. Cl. ............... 438/123; 257/704; 257/712; 257/717; 257/E23.051; 361/704

(58) Field of Classification Search ............... None
See application file for complete search history.

(56) References Cited

U.S. PATENT DOCUMENTS

| | | | | |
|---|---|---|---|---|
| 4,313,492 A | * | 2/1982 | Andros et al. ........ | 165/104.26 |
| 5,729,052 A | * | 3/1998 | Tonti et al. ........ | 257/712 |
| 6,292,369 B1 | | 9/2001 | Daves et al. | |
| 6,637,506 B2 | * | 10/2003 | Gektin et al. ........ | 165/185 |
| 2007/0127211 A1 | * | 6/2007 | Macris et al. ........ | 361/700 |
| 2007/0137300 A1 | * | 6/2007 | Dwyer et al. ........ | 73/504.01 |
| 2008/0137300 A1 | * | 6/2008 | Macris et al. ........ | 361/699 |

* cited by examiner

*Primary Examiner*—Alonzo Chambliss
(74) *Attorney, Agent, or Firm*—Stephen C. Kaufman; Eustus D. Nelson; Daryl K. Neff (57) ABSTRACT

A surface adapting cap with an integrated adapting thermally conductive material on single and multi chip module provides reduced gap tolerance and hence better thermal performance of the semiconductor device which enhances the reliability of the semiconductor device. In one of the embodiments the cap is modified with an integrated, confined, and high thermal adaptive material. The membrane on this system is highly flexible. The cap is preassembled to the chip at a temperature above liquidus below curing temperature of the adaptive material. At this state, a hydrostatic pressure in the material develops due to the compression exerted from the cap to the chip and the confined volume of the buried material. This hydrostatic pressure causes the membrane to deflect and to adapt the warping and tolerances of the chip. Due to the adaptive surface the gap on each position of the chip and from chip to chip is same.

5 Claims, 14 Drawing Sheets

Figure-16

METHOD OF FABRICATING A SURFACE ADAPTING CAP WITH INTEGRAL ADAPTING MATERIAL FOR SINGLE AND MULTI CHIP ASSEMBLIES

FIELD OF INVENTION

The present invention relates to an improved surface adapting cap with an integrated adapting thermally conductive material on one or more semiconductor chips in single and multi chip modules.

BACKGROUND OF THE INVENTION

The present invention is related to semiconductor device manufacturing technology, and in particular to the integrated circuit (IC) packaging. Semiconductor device manufacturing technology is continually being pushed to higher levels of density and speed, with the objective of offering ever increasing functionality in a single package. This trend is resulting in sharply increasing power densities that demand continuous improvements in cooling efficiency. The introduction of multichip modules has intensified the need for efficient cooling even further by creating a more complex thermal environment. The Controlled Collapse Chip Connection (C4) protocol has emerged as the dominant assembly process for semiconductor chips in the Single Chip Module (SCM) and multichip Module (MCM) assembly process. In this assembly process each chip is inverted (or "flipped") and bonded both electrically and mechanically at each connecting interface to conductive elements on a supporting substrate. In this arrangement, the cooling mechanism is attached to the exposed upper surface (or "bottom") of each chip through a thermal interface. The primary factor in determining the efficiency of the cooling mechanism is the effectiveness of this thermal interface resistance. A reduction in thermal interface resistance produces a significant improvement in the overall thermal performance.

The thermal interface material comprises thermally conductive material (such as grease, adhesive, solder etc) that thermally connects the chip to the enclosing cap or sealing structure of the module. For optimal results it is necessary that the thickness of this interface material be regulated within the range of 100 µm to 10 µm. Current technological improvements suggest future trends to even lower distances of a few µm. The gap thickness is partially determined by the tolerances of the production process that range from about 60 µm to 12 µm dependent on the packaging system. This tolerance is caused by warpage of the chip, as well as position and angular tolerances in the placement of each chip. The trend towards ever reducing interface material thickness greatly enhances the significance of these variations.

U.S. Pat. No. 6,637,506, describes an apparatus for enhancing the thermal match between the parts of packaged semiconductor devices. It describes a heat spreader that is in thermal contact with a die and specifies the matching of the thermal expansion of a chip and the heat spreader by confining to a center portion of the heat spreader within the perimeter portion. The perimeter portion of the heat spreader is selected from the group of material with a lower thermal expansion coefficient (CTE) than the material for the center portion of the heat spreader. This arrangement fails to address the problems arising out of the warpage of the semiconductor chips.

U.S. Pat. No. 6,292,369 teaches lid structures and packaging modules having improved heat dissipation whose performance is characterized by a customized lid understructure to enable a reduction in the amount of compliant thermally conductive material in the primary heat dissipation path, wherein the understructure is customized according to the chip(s) that are to be housed. The customization is achieved by the use of shims and a deformable lid understructure. This understructure is not capable of providing enough pressure for a low viscosity medium to adapt to convex and concave chip warpage as it does not seal the deformable structure at the periphery.

The present invention aims to mitigate the above-mentioned problems and endeavours to provide a solution for maintaining the gap uniformity between chip and cap for single chip module (SCM) and multi chip modules (MCM) in the presence of chip warpage and variation in chip placement.

SUMMARY OF THE INVENTION

To mitigate the aforesaid drawbacks the aim of the present invention is to provide a method and an apparatus to accommodate chip warping, position and angle tolerances for single and multi chip module.

Another object of the invention is to reduce the gap tolerance between the semiconductor chip and cap and hence to increase the thermal performances by maintaining a constant gap thickness at every chip position and for every chip on the module thus compensating for the tolerances caused by variabilities in the cold plate, chip fabrication and in the controlled collapse chip connection (C4) soldering protocol.

According to an embodiment of the present invention, there is provided a surface adapting thermal interface between chip and enclosing structure or cap for single and multi chip module assembly comprising:

a high thermal conductivity, mechanically deformable membrane integrated with or attached to the enclosing structure or cap to create an enclosed space bounded on all sides by said membrane and cap; and
  a high thermal conductivity material confined within said enclosed space, and having a softening temperature or melting point slightly above the chip operating temperature.

The solution provided by the adaption material is capable of reducing gap thickness but requires changes in cap assembly and its attachment process supporting the semiconductor chip. The proposed system also allows full reworkability.

BRIEF DESCRIPTIONS OF THE DRAWINGS

The present invention is described with the help of accompanying drawings.

DETAILED DESCRIPTION OF THE INVENTION

An embodiment of the present invention provides an adaptive material integral to the cap that adapts to the warping and placement tolerances of the chip. This may be better understood with the aid of the FIG. 1, which shows typical tolerances in multi chip module packing. In this z-offset 101, cap bow 102, chip bow 103, and angle tolerance 104 are shown, where multiple chips are mounted onto a common substrate and covered with a cap. On the bottom side of the cap is a thermally conductive material integrated which adjusts for the non-uniformity between cap and chip and defines a constant and equal gap between chip and cap. This gap then gets filled with a compliant thermal interface material such as paste, gel or adhesive.

Figure 2:
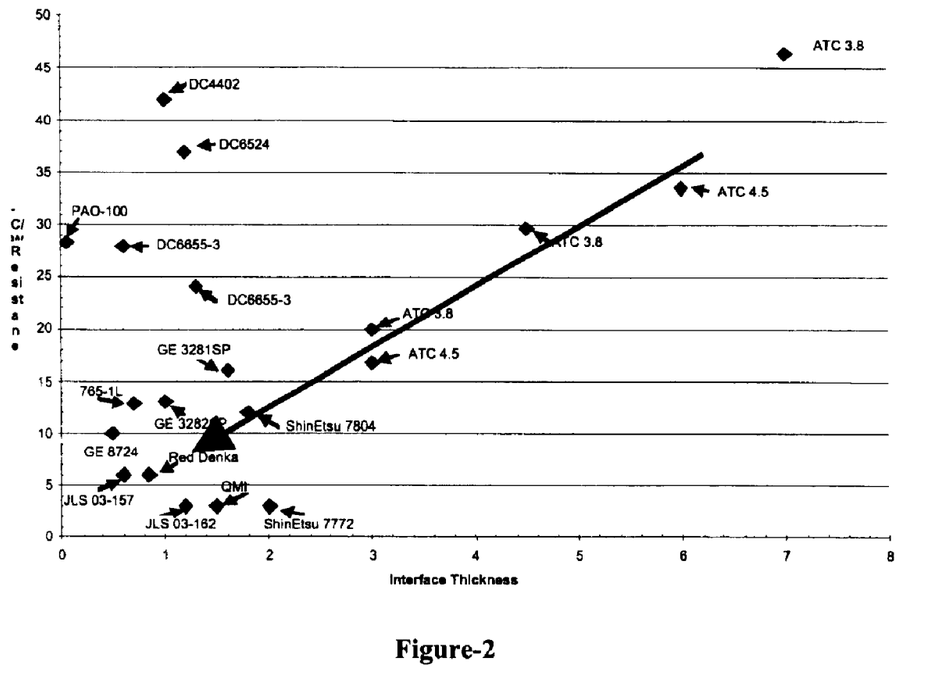
FIG. 2 shows the trend of thermal interface resistance and interface thickness.
Figure 3:
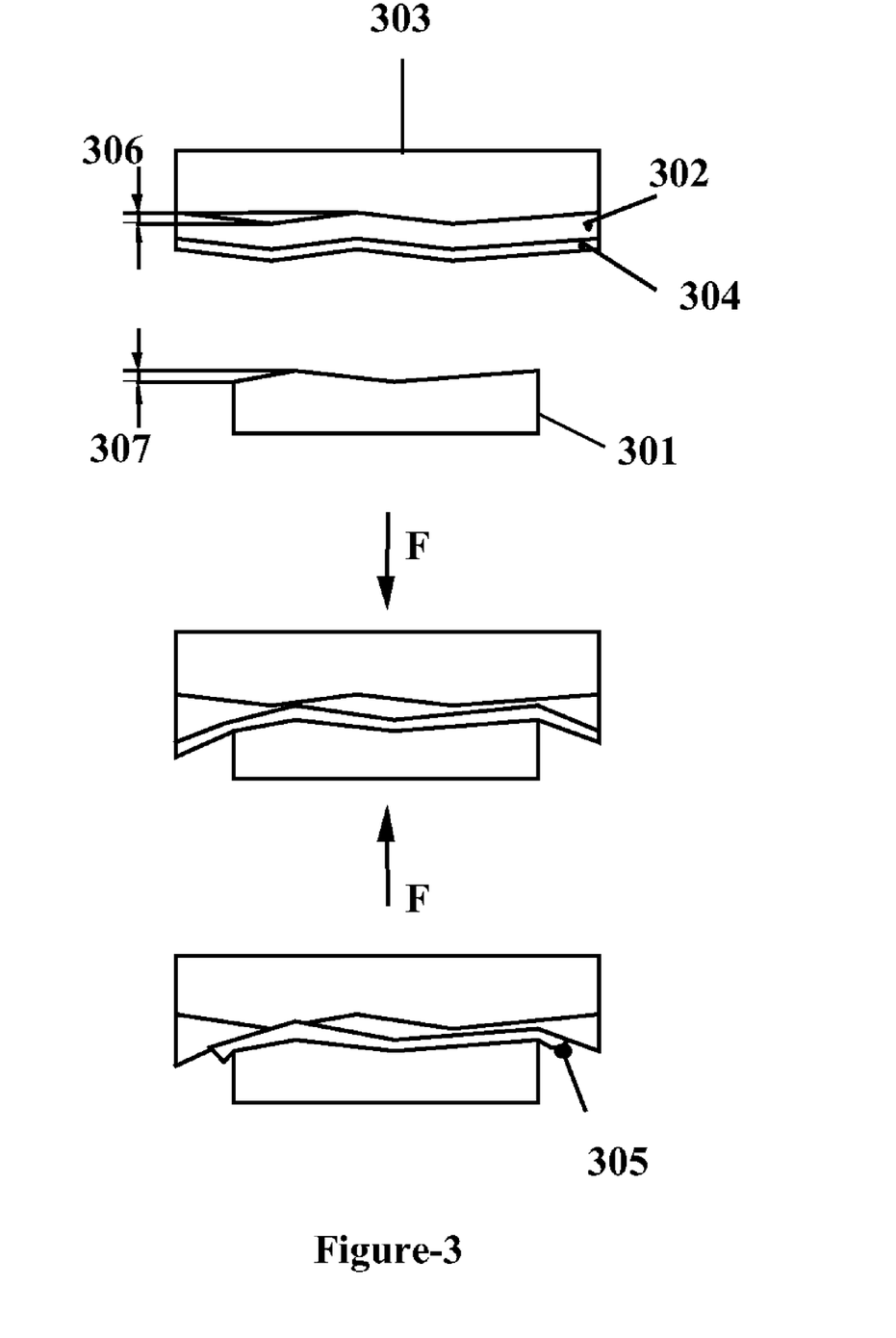
FIG. 3 shows a previously-proposed method.

FIG. 2, illustrates the variation in thermal resistance as a function of interface thickness for different paste materials with the arrow showing the current trend towards smaller and smaller gaps. The ratio between the gap thickness and the thermal resistance is related to the bulk conductivity of the material. Materials on the lower right have high bulk conductivity while materials on the upper left have low bulk conductivity. FIG. 3 shows a previously-proposed method used to adapt to the surface of the chip, where non-planarity of the cap 306 is allowed up to about 12 μm and when the bowing of the chip 307 is 10 μm and a solder foil 302 and a membrane foil 304 are positioned between cap 303 and chip 301. The parts are precompressed with a force F. at assembly temperatures above the liquidus temperature of the solder foil 302. Below the liquidus temperature the solder foil 302 stores the warping of the chip 301. The membrane foil 303 is then removed and the thermal interface material is applied and compressed. This approach requires a highly viscous and thermally conductive and adaptive material 302 in combination with a fast assembly speed. Otherwise the pressure built-up during the squeezing is too low to deflect the membrane 304 properly and the material is just squeezed out at location 305 beyond an edge of the chip. Since materials like solder 302 are very low in viscosity above their liquidus temperature, this principle does not work satisfactorily, especially in case of concave warping.

Due to this reason the above-described method includes the confinement of the adaptive material. This confinement allows the use of low viscous materials and allows reworkability. Another drawback of the method is the limited z-position tolerance due to the confinement of the adaptive material. In an embodiment of the present invention, the z-position tolerances are taken into account.

Figure 4:
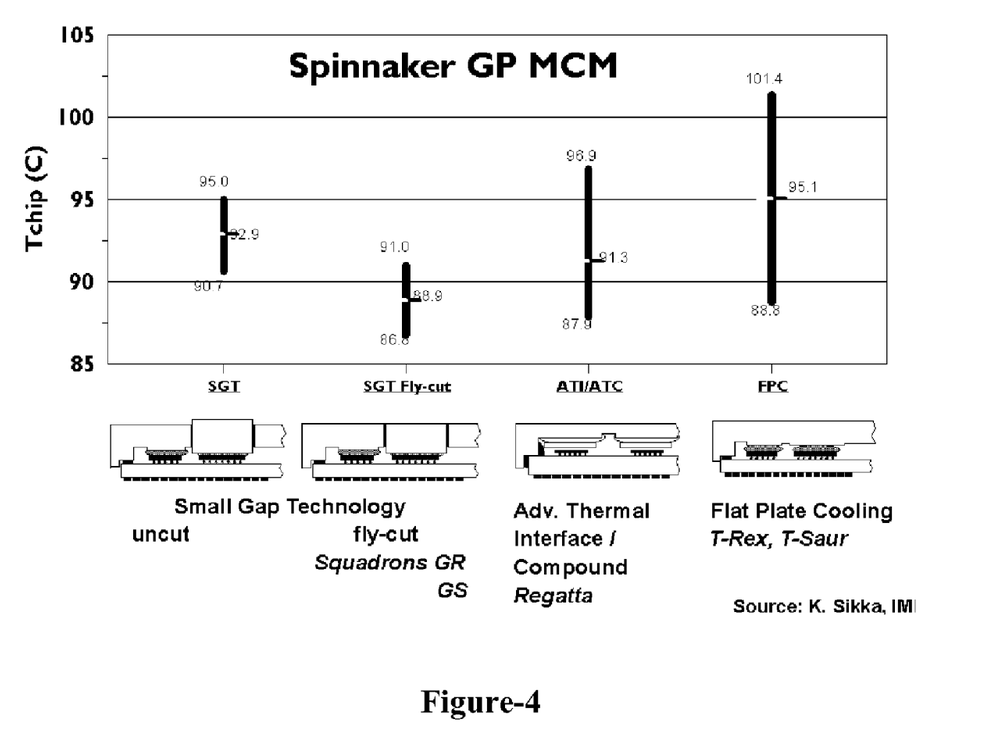
FIG. 4 shows small gap technology.

FIG. 4 shows a method, which reduces the variation in thermal interface gap caused by position and angle tolerances of the chips on multi chip modules. This technology is called small gap technology and produces lower mean values and half as much variation in the thermal resistance from chip to chip and module to module.

Figure 1:
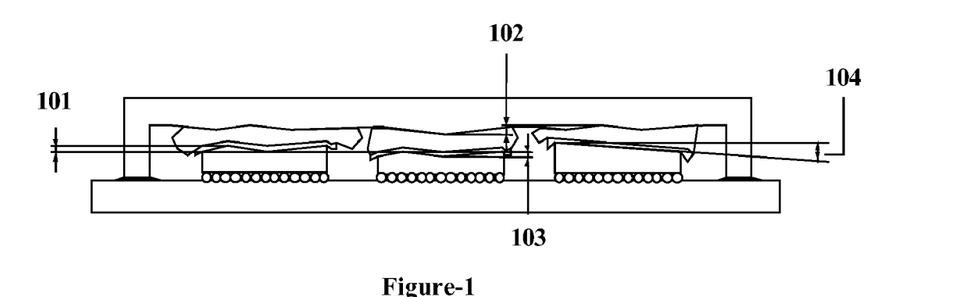
FIG. 1 shows the typical deviations from co-planarity in multi chip module (MCM).
Figure 5:
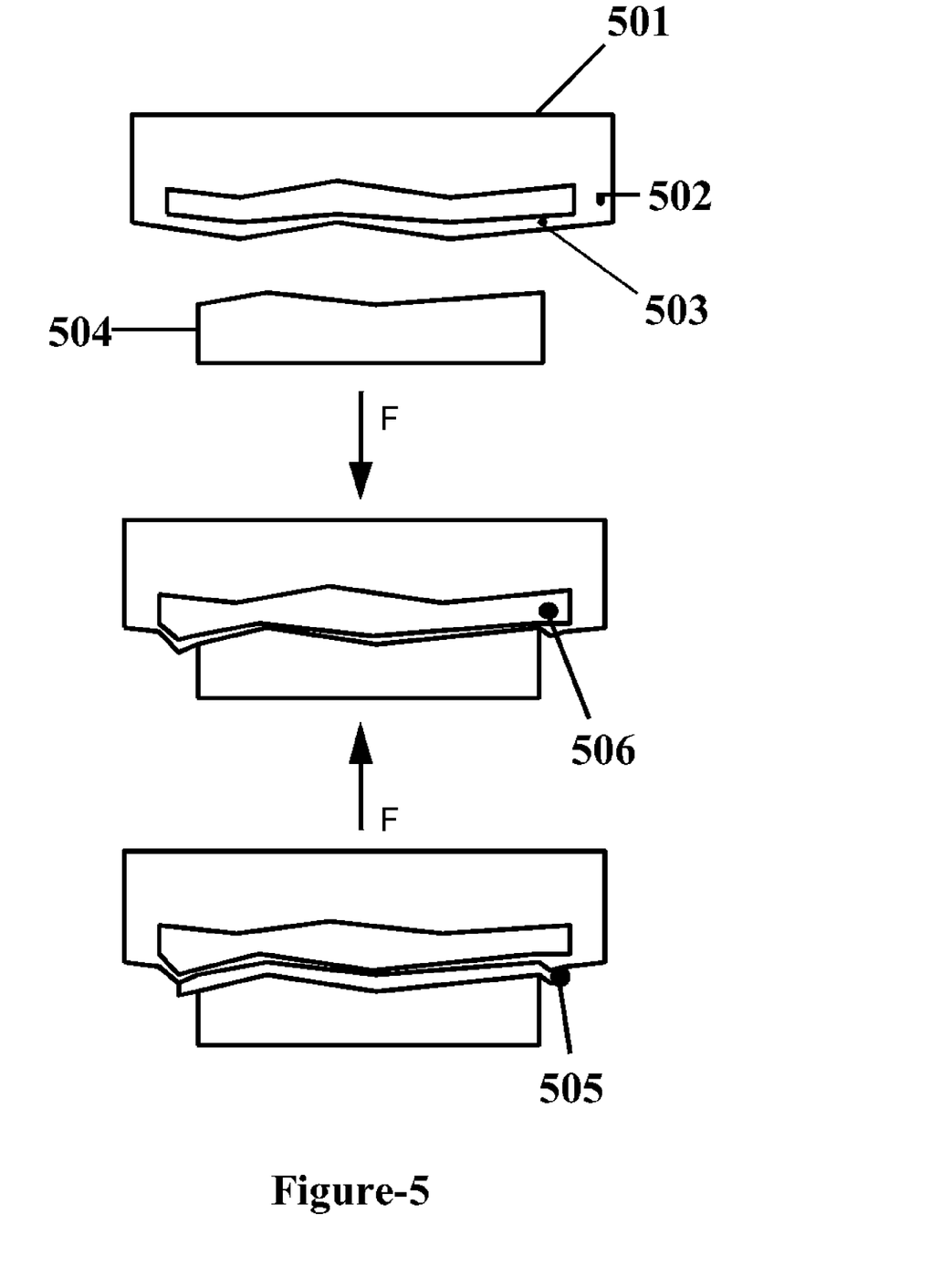
FIG. 5 shows an embodiment of the present invention for single chip module (SCM) and multi chip module (MCM).
Figure 6:
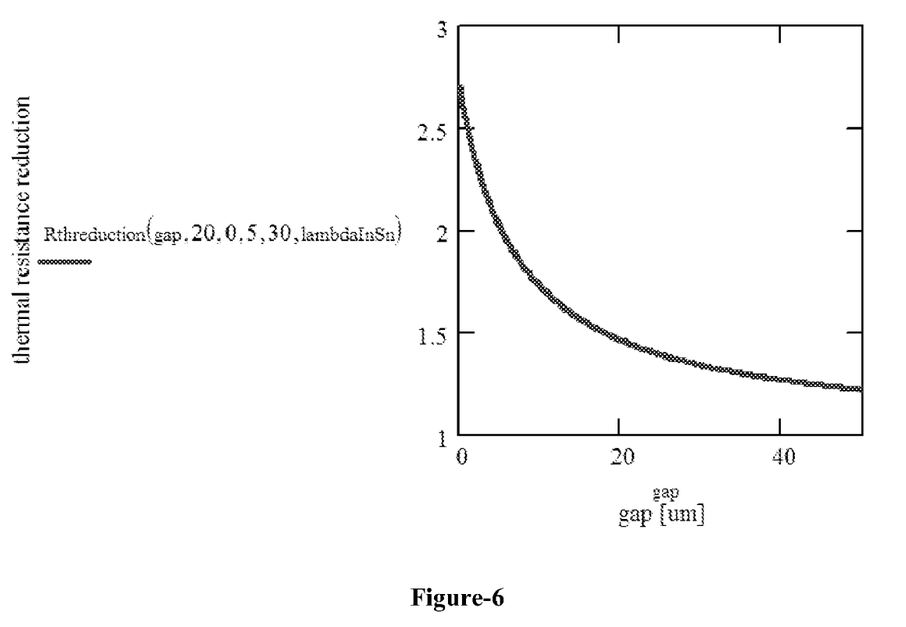
FIG. 6 shows a plot of the reduction of thermal resistance of the adaptive interface in single chip module (SCM) in accordance with an embodiment of the present invention.

An embodiment of the present invention shown in FIG. 5, proposes a method which may adapt to chip warpages as high as 60 μm. This technique further improves the mean value and the variations of the paste gap 505. Device cap 501, with integrated membrane 503 includes a buried, confined, high thermal conductivity adapting material with liquidus temperature slightly above the chip operating temperature or with. a possible solidification by a curing step. The membrane 503 may be made utilizing metal such as copper, which is highly flexible and can be surrounded by ridge 502. The cap 501 is preassembled to the chip 504 at a temperature above liquidus or below curing temperature of the buried adapting material. Under these conditions when the buried material is viscous a hydrostatic pressure is built-up in the material due to the compression between cap 501 and the chip 504 owing to the confined volume of the adapting material. The hydrostatic pressure 506 developed by the compression causes the integrated membrane 503 to deflect and to adapt to concave as well as convex warping and tolerances of the chip. When the adapting material solidifies by lowering the temperature or by the curing process this surface adaptation is stored in the cap 501. The thermally conductive interface material 505 is then applied and the cap 501 and the chip 504 are compressed again this time without causing the adapting material to soften. This technique ensures that the gap between the adaptive surface and each position of the chip 504 and from chip to chip (as shown in FIG. 1) will remain the same irrespective of variations in individual chip warpage and positioning tolerances. FIG. 6 shows the reduction factor of the maximal thermal resistance of the thermal interface material 505 in comparison with a non-adaptive cap for single chip module (SCM) as a function of the residual gap reached after the paste squeeze accounting for the reduced thermal conductivity of the adapting material 506 compared to copper for the following parameters:

| | |
|---|---|
| Thermal conductivity of TIM material | 3 W/(m * K) |
| Bowing of cap and chip | 20 μm |
| z-tolerance | 0 μm |
| Residual bowing after adaptation | 5 μm |
| Solder thickness | 30 μm |
| Solder | InSn Tl = 118° C., 34 W/(m * K) |

As shown in FIG. 6, for a residual bowing of 5 μm caused by misalignment or a difference between the driving point temperature and adaptation temperature after the adaptation method is applied, at a bond line of 10 μm the thermal resistance decreases by more then a factor of 1.5.

Figure 7:
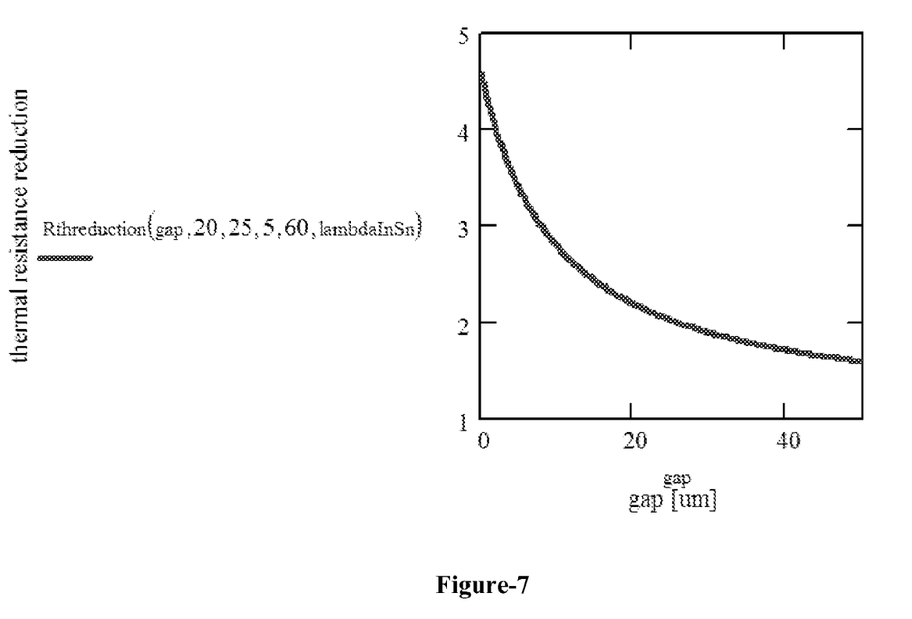
FIG. 7 shows a plot of the variation in thermal resistance with change in gap thickness for chip(s) in multi chip module (MCM) in accordance with an embodiment of the present invention.

FIG. 7 shows the reduction factor of the thermal resistance in multi chip module (MCM) as function of the gap thickness in the paste above the chip(s). For gaps below 10 μm the improvement is 2.5 times which is higher than in a single chip module due to the additional position and angle tolerance from chip to chip in a MCM:

| | |
|---|---|
| Bowing of cap and chip | 20 μm |
| z-tolerance | 25 μm |
| Residual bowing after adaptation | 5 μm |
| Solder thickness | 60 μm |
| Solder | InSn Tl = 118° C., 34 W/(m * K) |

Figure 8:
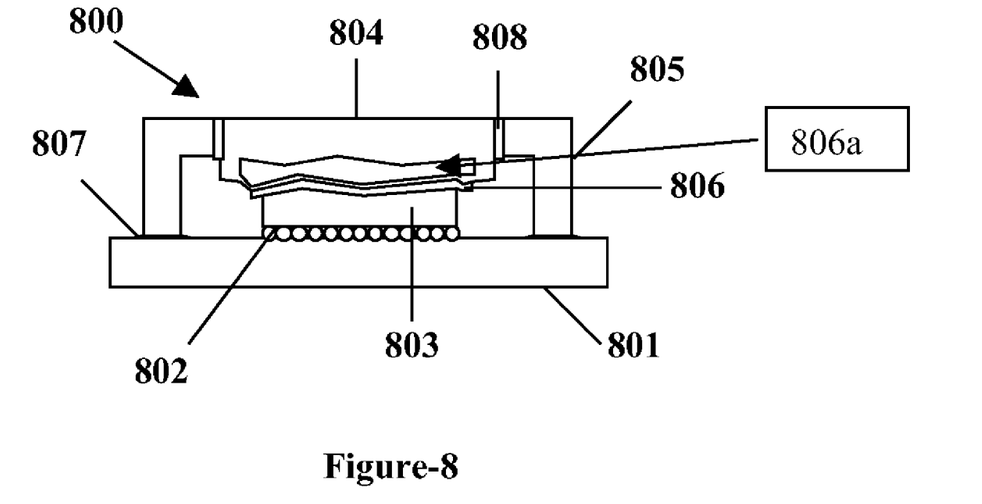
FIG. 8 shows one of the embodiments in accordance with the present invention for accommodating z-position tolerance as well.

In another embodiment as shown in FIG. 8, the adaptation method is implemented on a small gap technology pedestal that accommodates the majority of the z-position tolerance as well as global tilts. FIG. 8 illustrates the side view of a device 800 in accordance with an embodiment of the present invention in which the chip 803 is attached to a substrate 801 through solder bumps 802 and the adaptive small gap technology pedestal 804 is coupled to the chip 803 through a thermal interface paste 806. Annular extension(s) 805 (shown extending beyond location 808 of pedestal 804) of the cap is attached to the substrate 801 with fastening material 807 to provide rigid support to the cap and enable overall stability. With the integrated flexible membrane and the enclosed adaptive material 806a surface non-parallelism, non-planarity and residual small z-variations are compensated with resulting uniformity improvement for the bondline thickness of the paste.

Figure 9:
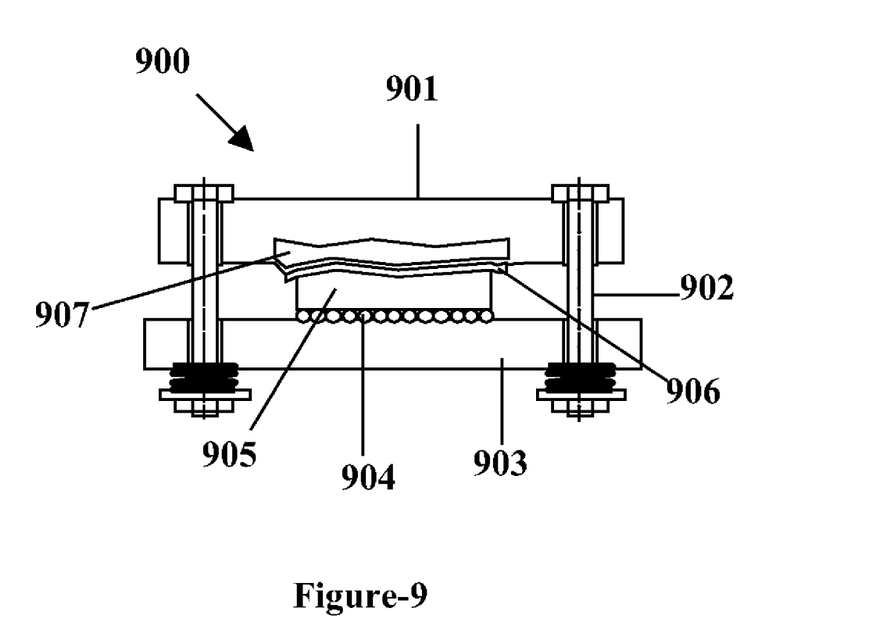
FIG. 9 shows one of the embodiments for capless module in accordance with the present invention.

In capless modules 900 as shown in FIG. 9, removal of the cap results in a reduced thermal resistance and hence in a better thermal performance. As shown in FIG. 9, mechanical fixations 902 hold the heat sink 901 on top of the chips with a controlled normal force thus replacing the cap. Heat sink 901 is fixed to the substrate 903 through mechanical fixations 902. Chip 905 is mounted to the substrate 903 via solder bumps 904. Heat sink 901 is coupled to the chip 905 through thermal interface paste 906 with uniform bond line thickness, between heat sink 901 and chip 905 possible by the enclosed adaptive material 907.

Figure 10:
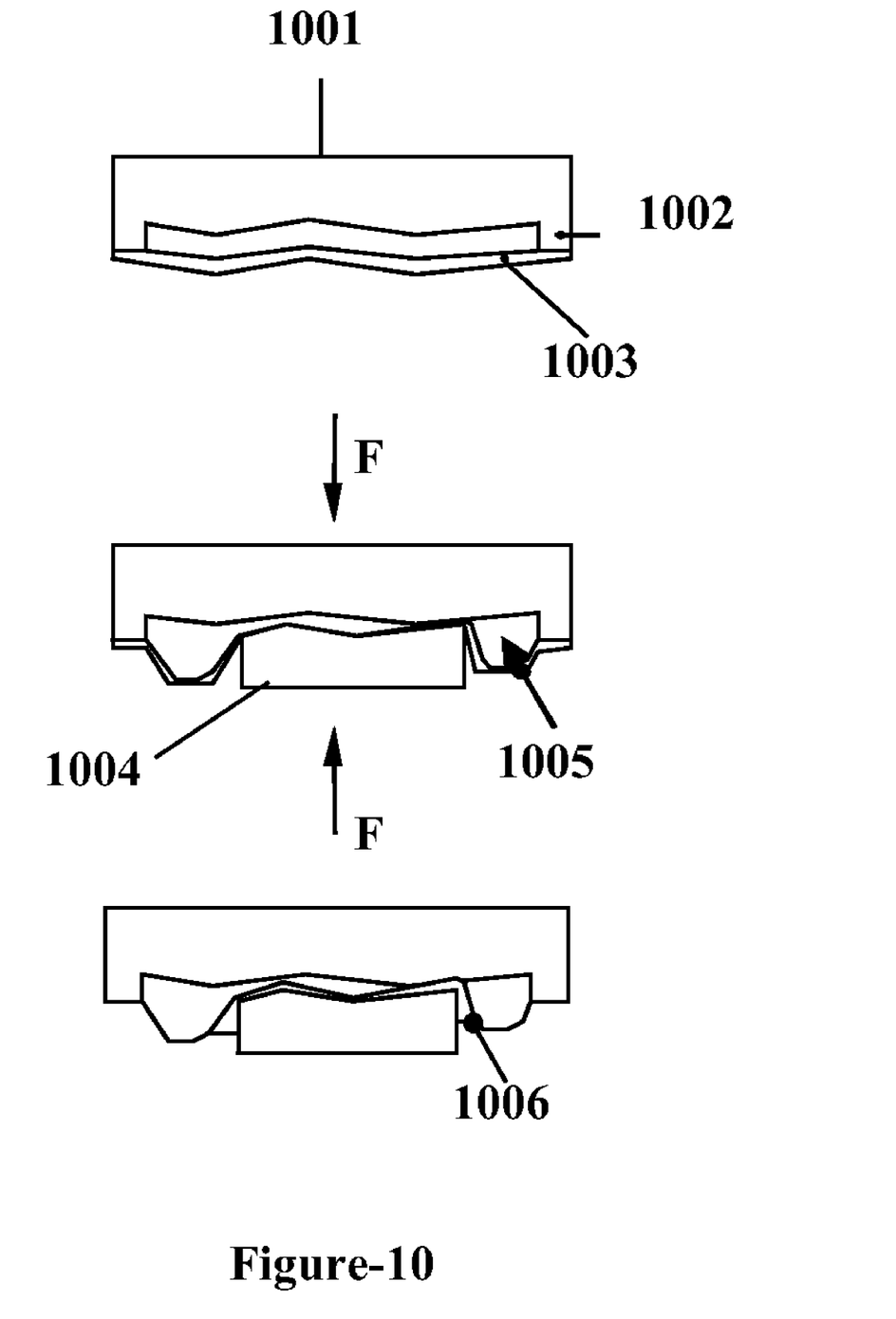
FIG. 10 shows another embodiment of the present invention, which utilizes highly elastic and low stiffness integrated membrane that is removed prior to the application of thermal interface material.

FIG. 10 shows another embodiment of the present invention, in which cap 1001 utilizes a highly elastic and low stiffness integrated membrane 1003 surrounded by a ridge 1002, containing the adaptive material 1005. Membrane 1003 allows an increase in confinement volume with build up of the hydrostatic pressure (shown as F) owing to elastic strain, Due to the lack of thermally conductive, low Young's Modulus materials, the elastic foil is preferably a thermally resistant polymer and is preferably removed after the solder reflow process. The cap 1001 is pressed to the desired chip 1004 with a normal force and the temperature is increased above the liquidus temperature of the solder. After the reflow process the membrane is removed, a paste material 1006 is applied, arid the cap is pressed onto the chip.

Figure 11A:
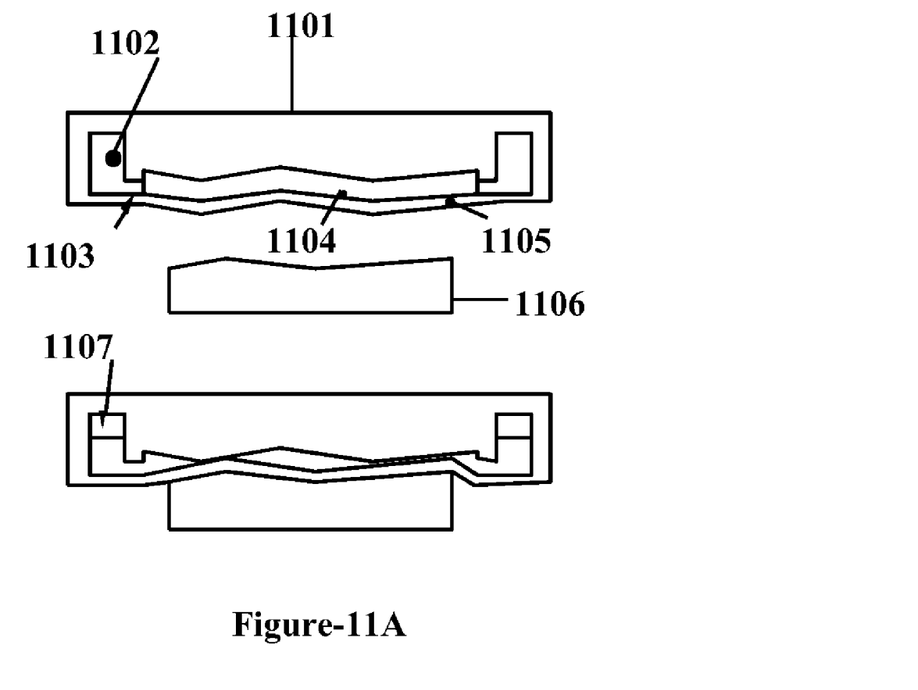
FIGS. 11A and 11B shows other embodiments in accordance with the present invention comprising closed or open air pockets which act as reservoirs and deliver the needed backpressure to the viscous medium.
Figure 11B:
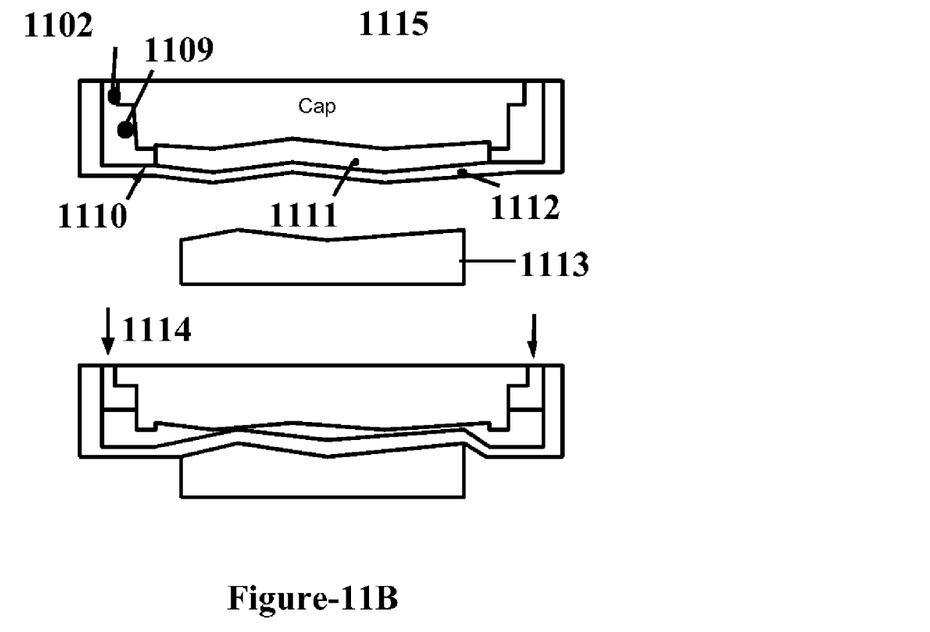

FIG. 11 shows yet another embodiment, where air pockets 1102 are provided that can accept excess solder 1104 during the reflow process. The whole compartment is sealed by the same membrane 1105 which may also act as a valve 1103 for flow control. The chip 1106 is compressed against the cap assembly 1101, which results in the overflow of the surface adaptable material through air pockets 1107 for control of applied pressure within the adaptive material chamber. FIG.11B is yet another implementation showing chip 1113, in which cap assembly 1115, has surface adaptable material 1111 sealed by membrane 1112 with valve 1110. Air pockets are used which have ports 1102 on the rear such that the pressure in the reservoir 1109 can be controlled by an external pressure gauge 1114.

Figure 12:
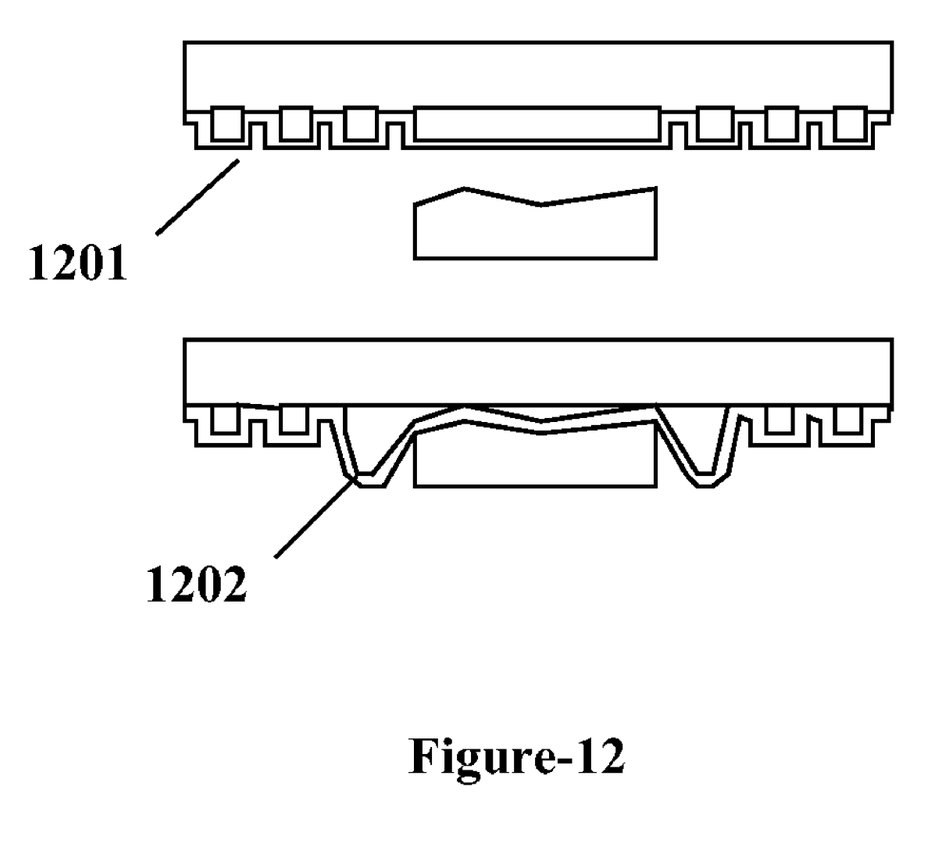
FIG. 12 shows the extension in FIG. 11 of the present invention in accordance with the present invention with multiple reservoir structure and adhesion controlled brake joints.

FIG. 12 is an extension of FIG. 11A and FIG. 11B employing multiple confined reservoirs 1201 are created using defined adhesion bonds. Local delamination (shown at 1202) of these adhesion bonds at elevated hydrostatic pressure increases the volume for liquid adaptation.

Figure 13:
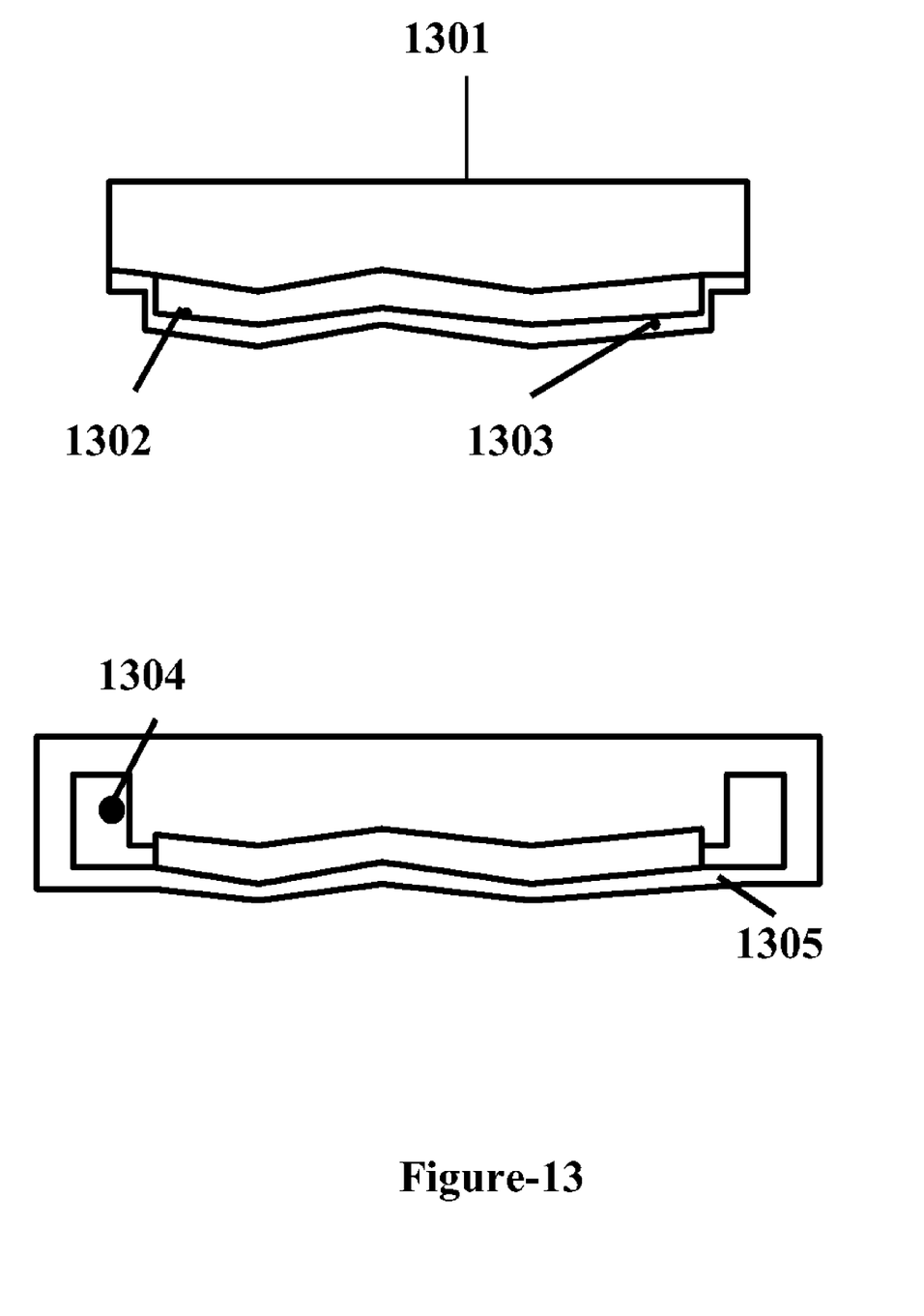
FIG. 13 shows the possible manufacturing process as explained in above mentioned FIGS. 5-12.

Possible manufacturing process is shown in the FIG. 13, in which cap 1301 assembly consists of solder 1302 and integrated membrane 1303. Solder 1302 consists of a preform foil, screen printed solder paste or electroplated material, while the integrated membrane 1303 comprises steps of electroplating, foil with roller bonding to the frame or sputtering. Valve 1305 is provided for flow control while air pocket 1304 accommodates any of the overflow that occurs.

Figure 14:
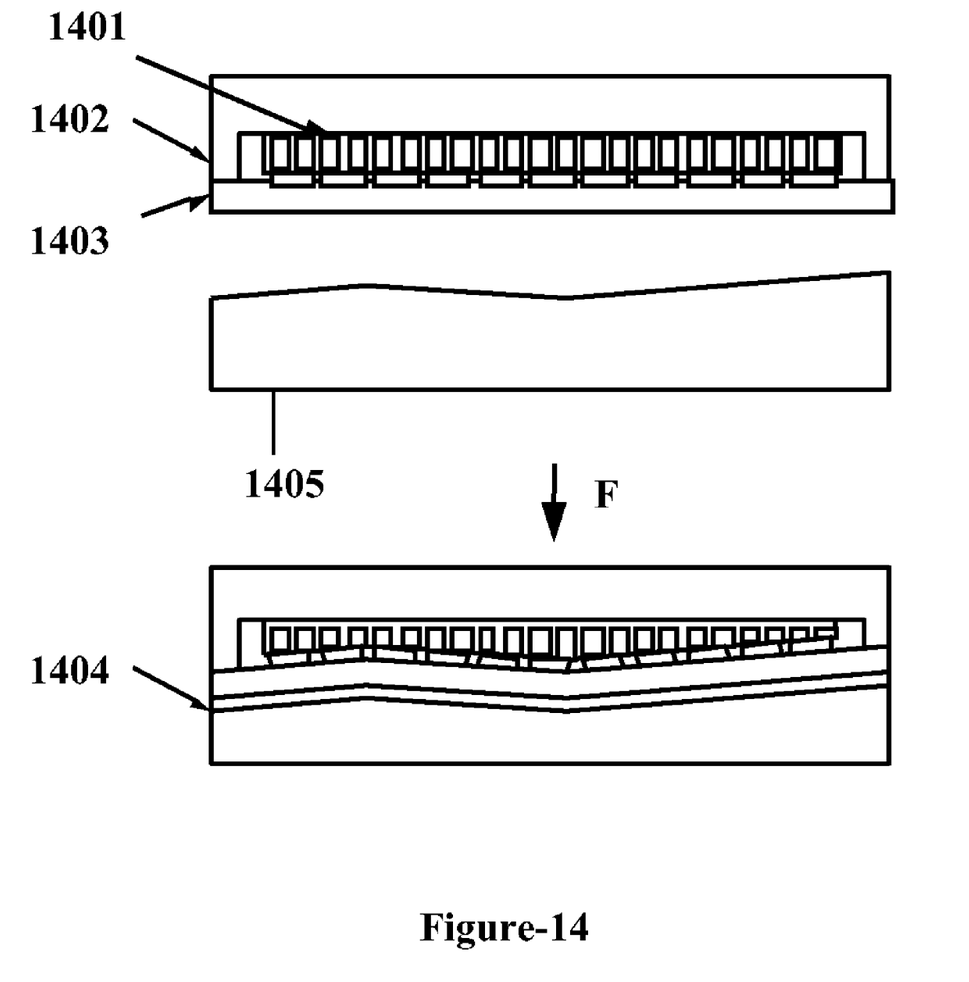
FIG. 14 expands the previously described adaptation method to dynamic adaptation method.

The adaptation method of the present invention can also be extended to a dynamic adaptation method. To have uniform and constant gap at different driving temperatures, the system should have low stiffness during operation but still serving with a restoring force to deform the membrane elastically to the same actual chip warpage. For uniform gap thickness at different operating temperatures, the adaptation material should be a liquid or having low stiffness. Eutectic GaInSn, which is liquid at room temperature, may be used. It may also be a phase changing material which is liquid below driving temperature. These kinds of materials show a dynamic adaptation property. In this arrangement besides achieving the improved thermal resistance, paste pumping would also be reduced due to the reduction in gap changes which causes the paste material 1404 to flow.

FIG. 14 shows a dynamic adaptive microchannel cold plate with a low stiffness material having gas enclosures 1401, which allow a volumetric compression in supporting the fin structure 1402 attached to the base plate membrane 1403. The coldplate is attached to the chip in a constant force mode which causes the membrane to adapt to the actual chip warpage.

Alternatively, the pressure built up by the coolant which gets pumped around in a closed or open loop system causes the membrane 1403 to adapt dynamically the surface of the chip 1405.

Figure 15:
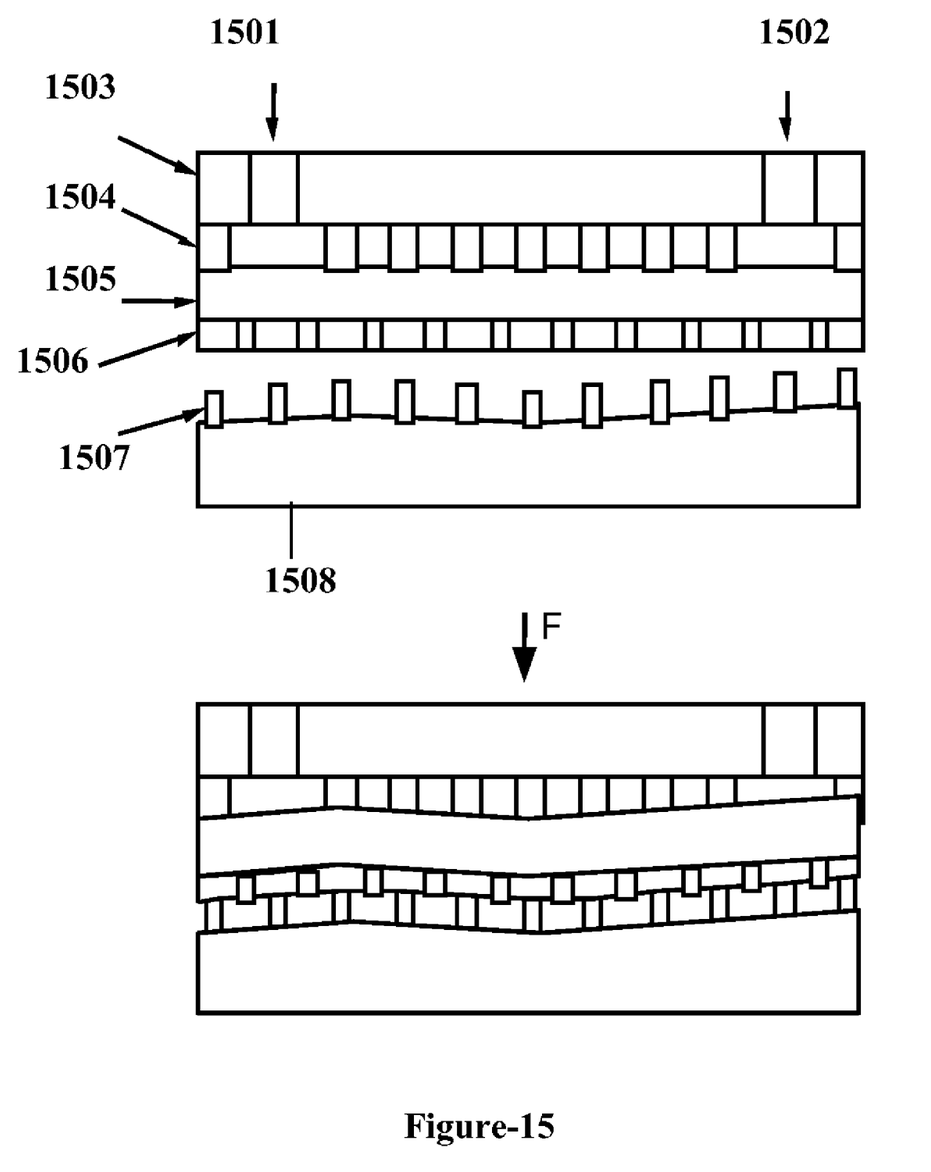
FIG. 15 shows another embodiment in accordance with the present invention comprising flexile manifold and jet membrane.
Figure 16:
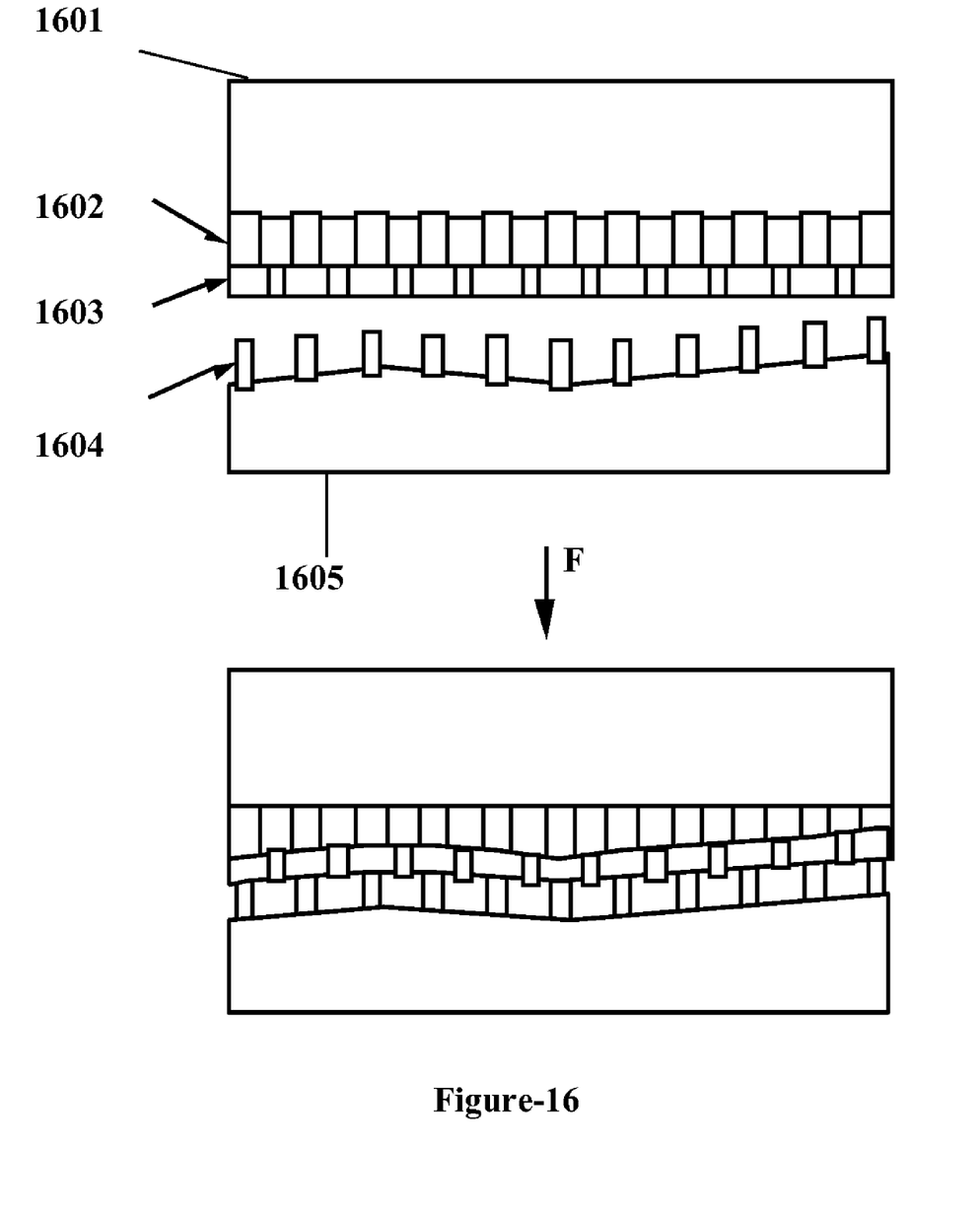
FIG. 16 shows another embodiment in accordance with the present invention as explained in FIG. 15 comprising flexile jet membrane.

FIG. 15 illustrates an alternative arrangement in which cap assembly 1503 (having ports 1501, 1502 similar to those shown in FIG. 11B) includes a low stiffness patterned sealing gasket 1504 that allows the dynamic adaptation of the flexible manifold 1505 including the jet membrane 1506. Alternatively, as shown in FIG. 16, the cap assembly 1601 may allow for dynamic adaptation of or just the jet membrane 1603. In each case, spacers 1507 (or spacers 1604) on the chip 1508 (or chip 1605) define the needed gap between membrane 1506 (or membrane 1603) and chip 1508 (or chip 1605). This approach reduces abnormal flow distribution of liquid in the gap caused by surface bowing (gap tolerances) as explained in FIG. 1. Therefore this approach allows a reduction in the gap thickness due to the smaller gap tolerance, which is advantageous in terms of the cooling performance of the semiconductor device.

We claim:

1. A method for fabricating a semiconductor chip assembly including a surface adapting cap with an integrated adapting thermally conductive material, comprising the steps of:
    (a) forming a cap including a mechanically deformable membrane having a high thermal conductivity, a sealing structure, and an adaptive material, the adaptive material enclosed within a space defined by the membrane and the sealing structure, the adaptive material having a high thermal conductivity and that either has a softening or liquidus temperature at least slightly above the operating temperature of the at least one chip, or which initially exists in form of a paste or liquid and then is subject to harden above a curing temperature by a curing process;

(b) preassembling said cap onto a rear face of the at least one chip under pressure at a temperature above the softening or liquidus temperature sufficient for the adaptive material to do at least one of the softening or change to liquidus, or sufficient for the adaptive material to begin hardening in the curing process, causing said membrane and adaptive material to conform to the surface profile of the at least one chip under influence of the hydrostatic pressure developed by the compression and produce surface adaptation in said membrane and adaptive material, and then lowering the temperature, whereby said adaptive material solidifies and stores said surface adaptation; and (c) then assembling said cap having said stored surface adaptation with the at least one chip and a thermally conductive interface material between the cap and the at least one chip to form said semiconductor chip assembly by compressing again without causing the adaptive material to soften.

2. A method as claimed in claim 1 wherein said membrane includes a thermally conductive foil.

3. A method as claimed in claim 1 wherein step (a) includes forming said membrane by electroplating or sputtering a thermally conductive material over a supporting filler material assembled with the sealing structure.

4. A method as claimed in claim 1 wherein said adaptive cap includes one or more enclosed or open air-pockets for assisting in its controlled deformation 5. A method as claimed in claim 1 wherein step (a) includes attaching said membrane at several separated points, and step (b) includes causing said membrane to delaminate under pressure.

* * * * *